US 10,854,737 B2

(12) United States Patent
Choi et al.

(10) Patent No.: US 10,854,737 B2
(45) Date of Patent: Dec. 1, 2020

(54) PLASMA TREATMENT ON METAL-OXIDE TFT

(71) Applicant: Applied Materials, Inc., Santa Clara, CA (US)

(72) Inventors: Soo Young Choi, Fremont, CA (US); Beom Soo Park, San Jose, CA (US); Yi Cui, San Jose, CA (US); Tae Kyung Won, San Jose, CA (US); Dong-Kil Yim, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/874,081

(22) Filed: Jan. 18, 2018

(65) Prior Publication Data

US 2018/0145157 A1    May 24, 2018

Related U.S. Application Data

(63) Continuation of application No. 15/001,156, filed on Jan. 19, 2016, now Pat. No. 9,887,277.

(60) Provisional application No. 62/106,905, filed on Jan. 23, 2015.

(51) Int. Cl.
| *H01L 23/31* | (2006.01) |
| *H01L 21/02* | (2006.01) |
| *H01L 29/66* | (2006.01) |
| *H01L 29/786* | (2006.01) |

(52) U.S. Cl.
CPC .... *H01L 29/66969* (2013.01); *H01L 21/0234* (2013.01); *H01L 23/3171* (2013.01); *H01L 29/7869* (2013.01); *H01L 2924/0002* (2013.01)

(58) Field of Classification Search
CPC .................................................. H01L 23/3171
See application file for complete search history.

(56) References Cited

U.S. PATENT DOCUMENTS

| 5,858,879 | A | 1/1999 | Chao et al. |
| 6,451,390 | B1 | 9/2002 | Goto et al. |
| 6,794,311 | B2 | 9/2004 | Huang et al. |
| 2002/0086164 | A1* | 7/2002 | Anzaki ............. B32B 17/10174 428/432 |
| 2003/0186561 | A1* | 10/2003 | Law ...................... C23C 16/402 438/788 |
| 2006/0003603 | A1 | 1/2006 | Fukuchi |
| 2014/0217395 | A1* | 8/2014 | Facchetti ............ H01L 29/7869 257/43 |
| 2016/0218000 | A1* | 7/2016 | Choi ................... H01L 29/7869 |

OTHER PUBLICATIONS

Cheung, KP, "Plasma-assisted wafer de-chucking (power-lift) process induced charging damage", Aug. 7, 2002, IEEE, pp. 25-28. (Year: 2002).*
Office Action for U.S. Appl. No. 15/001,156 dated Jul. 5, 2016.
Office Action for U.S. Appl. No. 15/001,156 dated Jan. 11, 2017.
Final Office Action for U.S. Appl. No. 15/001,156 dated Jul. 27, 2017.

* cited by examiner

*Primary Examiner* — Allen L Parker
*Assistant Examiner* — Gustavo G Ramallo
(74) *Attorney, Agent, or Firm* — Patterson + Sheridan LLP

(57) ABSTRACT

Techniques are disclosed for methods of post-treating an etch stop or a passivation layer in a thin film transistor to increase the stability behavior of the thin film transistor.

20 Claims, 6 Drawing Sheets

PLASMA TREATMENT ON METAL-OXIDE TFT

CROSS-REFERENCE TO RELATED APPLICATIONS

This application is a continuation of U.S. patent application Ser. No. 15/001,156, filed Jan. 19, 2016, which claims benefit of U.S. Provisional Patent Application No. 62/106,905, filed Jan. 23, 2015, both of which are incorporated by reference herein in their entirety.

BACKGROUND

Field

Embodiments described herein generally relate to methods of manufacturing a thin film transistor (TFT).

Description of the Related Art

Thin film transistors (TFTs) are used as switching and driving devices in almost all integrated circuits (IC). Additionally, TFTs are utilized in the flat panel display (FPD) industry to control pixels. To ensure that the TFT functions as intended, the TFT should be stable and perform consistently with each use. Oftentimes, the threshold voltage, the positive bias temperature stress (PBTS), and the negative bias illumination stress (NBIS) of the TFT can vary over time, causing the on-voltage and the off-voltage of the TFT to vary in response. As these variables fluctuate, the TFT becomes unpredictable and may cause the switching and driving devices to malfunction.

Therefore, there is a need for a method to fabricate TFTs having stable behaviors.

SUMMARY

The present disclosure generally relates to a method of manufacturing a TFT. After the etch stop layer is patterned or the passivation layers are deposited, the etch stop layer or the passivation layers of the TFT can be exposed to an inert gas plasma without degrading MO-TFT performance, such as stability. Therefore, the inert gas plasma can be applied after the etch stop layer or the passivation layers for other purposes without concerning TFT degradation.

In one embodiment, a method of forming a thin film transistor is disclosed. The method includes depositing a semiconductor layer over a gate dielectric, a gate electrode, and a substrate, depositing an etch stop layer on the semiconductor layer, exposing the etch stop layer to an inert plasma, and forming source and drain electrodes.

In another embodiment, a method of forming a thin film transistor is disclosed. The method includes depositing a semiconductor layer over a gate dielectric, a gate electrode, and a substrate, depositing an etch stop layer on the semiconductor layer, forming source and drain electrodes, and exposing the etch stop layer to an inert plasma.

In another embodiment, a method of forming a thin film transistor is disclosed. The method includes depositing a semiconductor layer over a gate dielectric, a gate electrode, and a substrate, depositing a conductive layer on the semiconductor layer, forming source and drain electrodes, depositing one or more passivation layers over the source and drain electrodes, and exposing the one or more passivation layers to an inert plasma.

BRIEF DESCRIPTION OF THE DRAWINGS

So that the manner in which the above-recited features of the embodiments can be understood in detail, a more particular description of the embodiments, briefly summarized above, can be had by reference to embodiments, some of which are illustrated in the appended drawings. It is to be noted, however, that the appended drawings illustrate only examples of the embodiments and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure generally relates to a method of manufacturing a TFT. After the etch stop layer is patterned or the passivation layers are deposited, the etch stop layer or the passivation layers of the TFT can be exposed to an inert gas plasma without degrading MO-TFT performance, such as stability. Therefore, the inert gas plasma can be applied after the etch stop layer or the passivation layers for other purposes without concerning TFT degradation.

Figure 1A:
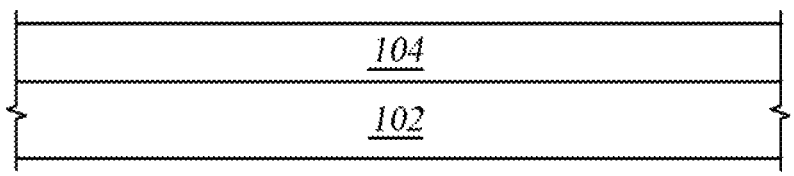
FIGS. 1A-1H schematically illustrate a TFT at various stages of fabrication, according to one embodiment.

FIGS. 1A-1H are schematic illustrations of a TFT at various stages of fabrication, according to one embodiment. As shown in FIG. 1A, the TFT is fabricated by depositing a conductive layer 104 over a substrate 102. Suitable materials that may be utilized for the substrate 102 include silicon, glass, plastic, and semiconductor wafers. Suitable materials that may be utilized for the conductive layer 104 include chromium, molybdenum, copper, aluminum, tungsten, titanium, and mixtures or combinations thereof. The conductive layer 104 may be formed by physical vapor deposition (PVD) or other suitable deposition methods, such as electroplating, electroless plating, or chemical vapor deposition (CVD).

Figure 1B:
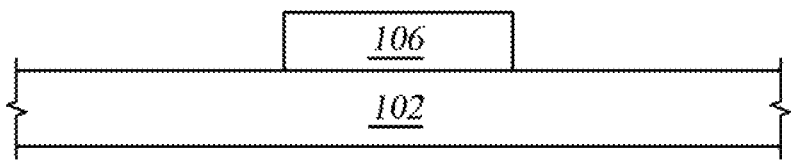

As shown in FIG. 1B, the conductive layer 104 is patterned to form a gate electrode 106. The patterning may occur by forming either a photolithographic mask or a hard mask over the conductive layer 104 and exposing the conductive layer 104 to an etchant. Depending upon the material utilized for the conductive layer 104, the conductive layer 104 may be patterned using a wet etchant or by exposing the conductive layer 104 not covered by the mask to an etching plasma. In one embodiment, the conductive layer 104 may be patterned by etching areas of the conductive layer 104 that are not covered by a mask with an etching plasma comprising etchants such as $SF_6$, $O_2$, $Cl_2$, and mixtures or combinations thereof.

Figure 1C:
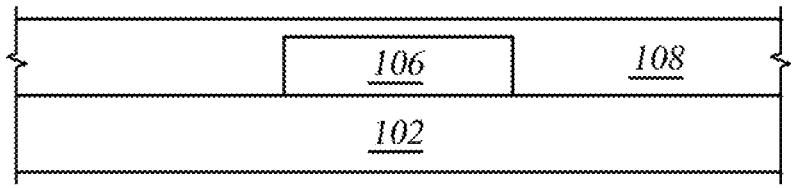

As shown in FIG. 1C, after the gate electrode 106 has been formed, a gate dielectric layer 108 is deposited thereover. Suitable materials that may be utilized for the gate dielectric layer 108 include silicon nitride, silicon oxide, and silicon oxynitride. Additionally, while shown as a single layer, it is contemplated that the gate dielectric layer 108 may comprise multiple layers, each of which may comprise a different chemical composition. Suitable methods for depositing the gate dielectric layer 108 include conformal deposition methods such as plasma enhanced chemical vapor deposition (PECVD), chemical vapor deposition (CVD), atomic layer deposition (ALD), and/or HDP (high density plasma).

Figure 1D:
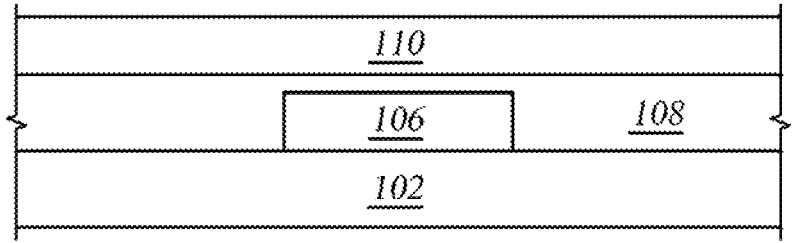

As shown in FIG. 1D, a high mobility active layer 110 is deposited. Suitable materials that may be used for the high mobility active layer 110 include any semiconducting metal oxide material, for example indium-gallium oxide, IGZO, zinc oxide, zinc oxynitride, indium-tin oxide, indium zinc oxide, or mixtures and combinations thereof. The active layer 110 may be deposited by suitable deposition methods such as PVD, ALD, CVD and PECVD. In one embodiment, the PVD may comprise applying a DC bias to a rotary cathode.

Figure 1E:
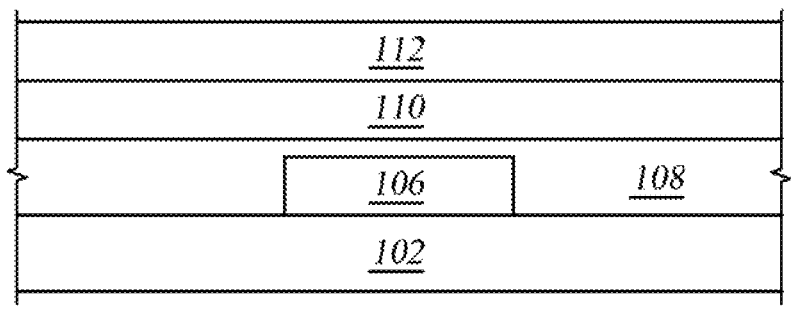

As shown in FIG. 1E, an etch stop layer 112 may be deposited over the active layer 110. Suitable materials that may be used for the etch stop layer 112 include silicon nitride, silicon oxide, and silicon oxynitride. Suitable methods for depositing the etch stop layer 112 include conformal deposition methods such as PECVD, CVD, ALD, and/or HDP (high-density plasma).

Figure 1F:
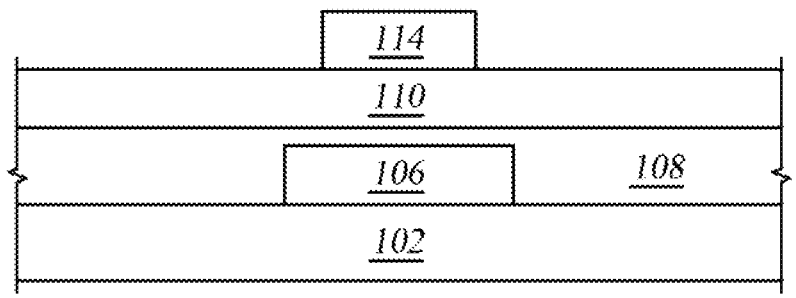

As shown in FIG. 1F, the etch stop layer 112 is patterned to form an etch stop 114. The etch stop layer 112 may be patterned using a wet etchant or a dry etchant. The etch stop layer 112 may be patterned such that the etch stop 114 is centrally located on the active layer 110. In one embodiment, the etch stop 114 is exposed to an inert plasma after patterning the etch stop layer 112. The inert plasma may be Ar plasma, $N_2$ plasma, or He plasma. The etch stop 114 may be exposed to the inert plasma for a period of about 180 seconds. Exposing the etch stop 114 to a post-treatment inert plasma does not change or degrade the stability of the completed TFT, allowing the TFT to work in a predictable manner during each use, thus producing consistent results regardless of the device with which the TFT is utilized.

Figure 1G:
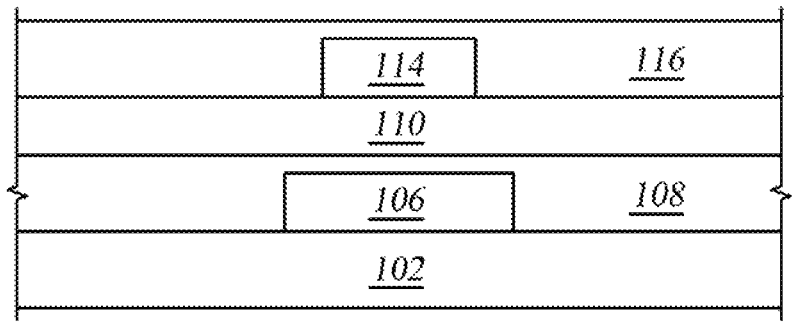

As shown in FIG. 1G, a conductive layer 116 may be deposited over the etch stop 114. Suitable materials that may be utilized for the conductive layer 116 include chromium, molybdenum, copper, aluminum, tungsten, titanium, and mixtures or combinations thereof. The conductive layer 116 may be formed by PVD or other suitable deposition methods such as electroplating, electroless plating, or CVD.

Figure 1H:
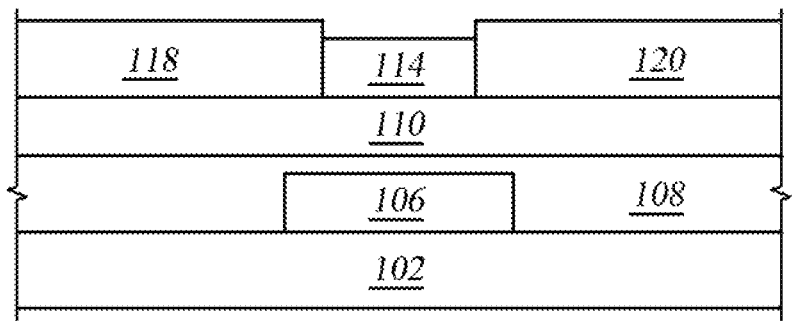

As shown in FIG. 1H, the conductive layer 116 is patterned to form a source 118 electrode and a drain 120 electrode, completing the TFT 100. The patterning may occur by forming either a photolithographic mask or a hard mask over the conductive layer 116 and exposing the conductive layer 116 to an etchant. Depending upon the material utilized for the conductive layer 116, the conductive layer 116 may be patterned using a wet etchant or by exposing the conductive layer 116 not covered by the mask to an etching plasma. In one embodiment, the conductive layer 116 may be patterned by etching areas of the conductive layer 116 that are not covered by a mask with an etching plasma comprising etchants such as $SF_6$, $O_2$, $Cl_2$, and combinations thereof. In one embodiment, the etch stop 114 may be exposed to an inert plasma after the source 118 electrode and drain 120 electrode are formed.

Treating the etch stop 114 with an inert plasma, either before or after the source 118 electrode and drain 120 electrode are formed, does not change or degrade the stability behavior of the TFT 100. The inert plasma may be Ar plasma, $N_2$ plasma, or He plasma. The etch stop 114 may be exposed to the inert plasma for a period of about 180 seconds. Exposing the etch stop 114 to a post-treatment inert plasma does not change or degrade the stability behavior, allowing the TFT to work in a predictable and consistent manner each use. Treating the etch stop 114 with an inert plasma, such as Ar, $N_2$, or He plasma, has little to no effect on the threshold voltage of the completed TFT. Furthermore, the post-treatment inert plasma on the etch stop 114 has little to no effect on the positive bias temperature stress (PBTS) or the negative bias illumination stress (NBIS) of the TFT. These variables allow the TFT to have the same on-voltage and the same off-voltage each time the TFT is operated. The on-voltage and the off-voltage of the TFT remain relatively stable and constant, not fluctuating or shifting to a more negative or positive voltage. Regardless of the device the TFT is utilized in, or the number of times the TFT is operated, the TFT produces consistent and reliable results, having an unchanged on-voltage and an unchanged off-voltage each use, increasing the overall stability behavior of the TFT.

Ideally, the TFT will operate in the same manner each use. If an unstable TFT operates differently each use, the results would be irregular, and the margin of error would be great. Thus, post-treating the etch stop 114 with an inert plasma allows for the TFT to operate in a consistent manner. Treating the TFT with other plasmas may not yield the same stability behavior as the inert plasmas. For example, both a pre-treatment and a post-treatment with $N_2O$ plasma on the etch stop 114 increases the threshold voltage of the TFT. The threshold voltage value may continue to increase with each use of the TFT. Both the pre-treatment and the post-treatment with $N_2O$ plasma on the etch stop 114 increase the PBTS and decrease the NBIS. Comparatively, a post-treatment with $H_2$ plasma on the etch stop 114 for about 180 seconds can shift the threshold voltage in the negative direction, or cause the TFT to short completely. A pre-treatment with $H_2$ plasma for a time period of about 180 seconds may detrimentally damage the active layer 110, and a low current may be induced. A pre-treatment with $H_2$ plasma for about 60 seconds may slightly damage the active layer 110, and may increase both the PBTS and the NBIS. A pre-treatment or post-treatment with $H_2$ plasma increases the amount of hydrogen on the etch stop 114 and the active layer 110 by hydrogen diffusion in the etch stop 114 and the active layer 110. Changing any one of the threshold voltage, PBTS, NBIS, or increasing the amount of hydrogen on the etch stop 114 may cause the on-voltage or the off-voltage of the TFT to fluctuate.

Exposing the etch stop 114 to Ar plasma or $N_2$ plasma yields favorable results. In Tables 1A-1C below, two Ar plasma post-treated etch stops are compared to two non-treated etch stops. In Tables 2A-2C below, two $N_2$ plasma post-treated etch stops are compared to two non-treated etch stops.

TABLE 1A

Etch Stop Layer Process

| ES | Pressure Torr | Temp. C. | Deposition rate Å/min | Deposition time sec | Post-treatment Gas | Post-treatment Time | Total Time sec |
|---|---|---|---|---|---|---|---|
| 1 | 1.00 | 225 | 465 | 129 |    |     | 129 |
| 2 | 1.00 | 225 | 465 | 129 | Ar | 180 | 309 |
| 3 | 1.50 | 225 | 164 | 365 |    |     | 365 |
| 4 | 1.50 | 225 | 164 | 365 | Ar | 180 | 545 |

TABLE 1B

TFT Initial

| ES | Ion A | Ioff A | Mo cm$^2$/Vsec | S V/dec | Von (10 V) V | Von range V |
|---|---|---|---|---|---|---|
| 1 | 1.1E−04 | 8.9E−12 | 10.8 | 0.70 | 0.5 | 4.5 |
| 2 | 1.1E−04 | 1.9E−13 | 10.3 | 0.65 | 1.1 | 4.3 |
| 3 | 4.1E−05 | 3.7E−12 | 5.8  | 0.79 | 6.6 | 2.5 |
| 4 | 5.8E−05 | 4.4E−13 | 6.7  | 0.82 | 5.4 | 2.0 |

TABLE 1C

TFT Stability

| ES | PBTS 60 C., +30 V | NBIS 1000i, 60 C., −30 V | PBTS − NBIS V |
|---|---|---|---|
| 1 | 2.54 | −4.61 | 7.15 |
| 2 | 2.56 | −4.89 | 7.45 |
| 3 | 2.90 | −3.73 | 6.63 |
| 4 | 3.21 | −3.85 | 7.07 |

TABLE 2A

Etch Stop Layer Process

| ES | Pressure Torr | Temp. C. | Deposition rate Å/min | Deposition time sec | Post-treatment Gas | Post-treatment Time | Total Time sec |
|---|---|---|---|---|---|---|---|
| 1 | 1.00 | 225 | 465 | 129 |       |     | 129 |
| 2 | 1.00 | 225 | 465 | 129 | N$_2$ | 180 | 309 |
| 3 | 1.50 | 225 | 164 | 365 |       |     | 365 |
| 4 | 1.50 | 225 | 164 | 365 | N$_2$ | 180 | 545 |

TABLE 2B

TFT Initial

| ES | Ion A | Ioff A | Mo cm$^2$/Vsec | S V/dec | Von (10 V) V | Von range V |
|---|---|---|---|---|---|---|
| 1 | 1.1E−04 | 8.9E−13 | 10.8 | 0.70 | 0.5 | 4.5 |
| 2 | 9.6E−05 | 1.6E−13 | 6.2  | 0.51 | 0.3 | 2.5 |
| 3 | 4.1E−05 | 3.7E−12 | 5.8  | 0.79 | 6.6 | 2.5 |
| 4 | 5.4E−05 | 1.9E−13 | 5.7  | 0.68 | 4.8 | 1.8 |

TABLE 2C

TFT Stability

| ES | PBTS 60 C., +30 V | NBIS 1000i, 60 C., −30 V | PBTS − NBIS V |
|---|---|---|---|
| 1 | 2.54 | −4.61 | 7.15 |
| 2 | 1.81 | −5.60 | 7.41 |
| 3 | 2.90 | −3.73 | 6.63 |
| 4 | 3.29 | −4.09 | 7.38 |

Tables 1A-10 and 2A-2C provide processing details of the TFT. Tables 1A-10 and 2A-2C further show a comparison between untreated TFTs and TFTs that have been post-treated with either Ar plasma or N$_2$ plasma, focusing on the TFT stability results of tables 1C and 2C.

Figure 2A:
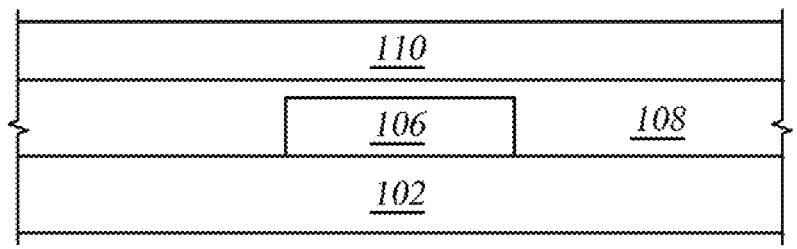
FIGS. 2A-2E schematically illustrate a TFT at various stages of fabrication, according to another embodiment.

FIGS. 2A-2E are schematic illustrations of a TFT at various stages of fabrication according to another embodiment. The structure illustrated in FIG. 2A is equivalent to the structure illustrated in FIG. 1D. It is to be understood the operations of FIGS. 1A-10 may be used to form the device of FIG. 2A.

Figure 2B:
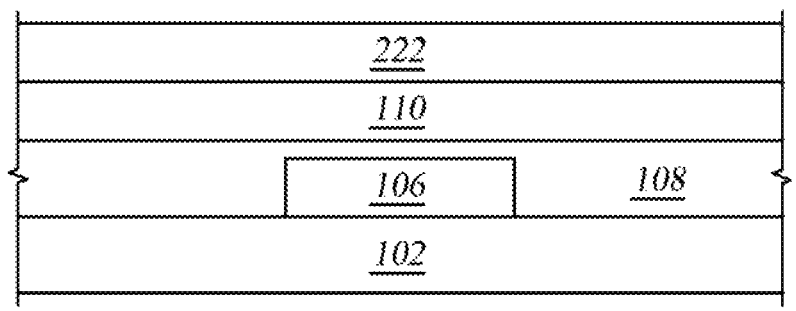

As shown in FIG. 2B, a conductive layer 222 may be deposited over the active layer 110. Suitable materials that may be utilized for the conductive layer 222 include chromium, molybdenum, copper, aluminum, tungsten, titanium, and combinations thereof. The conductive layer 222 may be formed by PVD or other suitable deposition methods such as electroplating, electroless plating, or CVD.

Figure 2C:
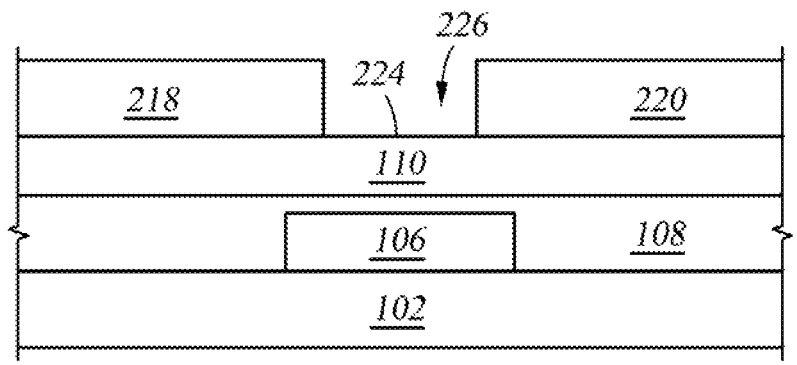

As shown in FIG. 2C, the conductive layer 222 is patterned to form a source electrode 218 and a drain electrode 220 by a back channel etch process. The patterning may occur by forming either a photolithographic mask or a hard mask over the conductive layer 222 and exposing the conductive layer 222 to an etchant. Depending upon the material utilized for the conductive layer 222, the conductive layer 222 may be patterned using a wet etchant or by exposing the conductive layer 222 not covered by the mask to an etching plasma. In one embodiment, the conductive layer 222 may be patterned by etching areas of the conductive layer 222 that are not covered by a mask with an etching plasma comprising etchants such as SF$_6$, O$_2$, and mixtures or combinations thereof. In forming the source electrode 218 and the drain electrode 220, a portion 224 of the active layer 110 is exposed. The exposed portion 224 is between the source and drain electrodes 218, 220. The area between the source and drain electrode 218, 220 is referred to as the active channel 226.

Figure 2D:
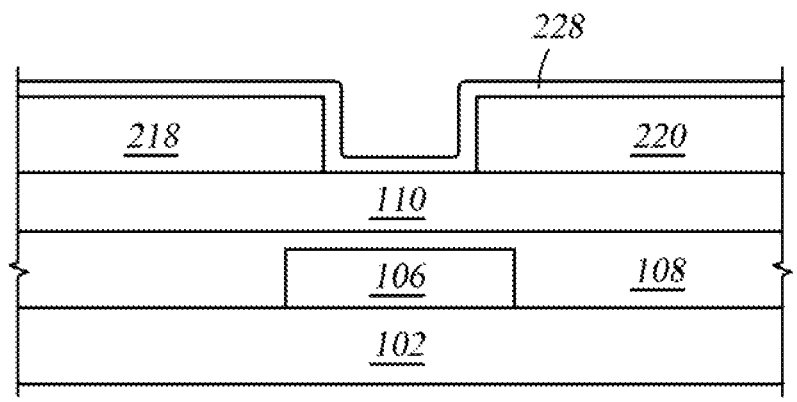
Figure 2E:
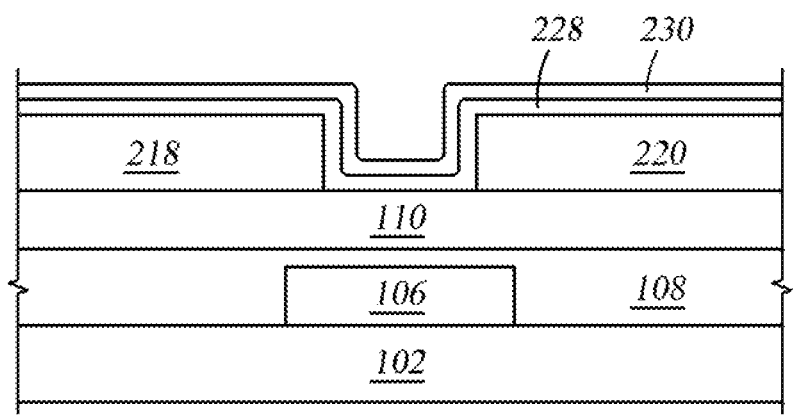

As shown in FIGS. 2D and 2E, multiple passivation layers 228, 230 are deposited over the active channel 226 and the source 218 and drain 220 electrodes. The first passivation layer 228 that is in contact with the exposed portion 224 of the active layer 110 comprises a low hydrogen containing oxide. The second passivation layer 230 is formed over the first passivation layer 228 and can comprise one or more additional layers of low hydrogen containing oxide, silicon nitride, silicon oxynitride, or mixtures or combinations thereof. Once the first and second passivation layers 228, 230 have been deposited, the TFT 200 is complete.

When silicon oxide is used as the first passivation layer 228, the silicon oxide can be deposited by PVD, PECVD, or HDP (high-density plasma). Considering the plasma damage associated with PVD, PECVD is the state of art approach to deposit a SiO$_2$ passivation layer because of highly conformal deposition results and less plasma damage to the deposited films. PECVD silicon oxide is normally performed with TEOS+O$_2$ or SiR$_4$+N$_2$O as the source gases, where the former provides better film quality than the latter. TEOS-based silicon oxide PECVD processes are difficult to scale up, particularly to process substrates that have a surface area of 43,000 cm$^2$ and above. However, the SiH$_4$-based silicon oxide PECVD process can be scaled up to process substrates that have a surface area of 43,000 cm$^2$ and above.

The passivation layers 228, 230 may also be post-treated with an inert plasma, like the etch stop 114 discussed above. Both passivation layers 228, 230 may be post-treated with the inert plasma, such as Ar plasma or N$_2$ plasma, or only one passivation layer 228, 230 may be exposed to the inert plasma. Treating the passivation layers 228, 230 of TFT 200 with an inert plasma has the same results as treating the etch stop 114 of TFT 100 discussed above. Exposing the passivation layers 228, 230 to an inert plasma does not change or degrade the stability behavior of the TFT 200, allowing the TFT 200 to operate in a consistent manner. Exposing the passivation layers 228, 230 to an inert plasma has little to no effect on the threshold voltage of the completed TFT 200. Furthermore, the post-treatment inert plasma on the passivation layers 228, 230 has little to no effect on the PBTS or the NBIS of the TFT 200. These variables allow the TFT 200 to have the same on-voltage and the same off-voltage each time the TFT 200 is operated, allowing the device the TFT is utilized with to function as intended. It is to be understood that while multiple passivation layers have been shown, a single passivation layer may be used.

Figure 3:
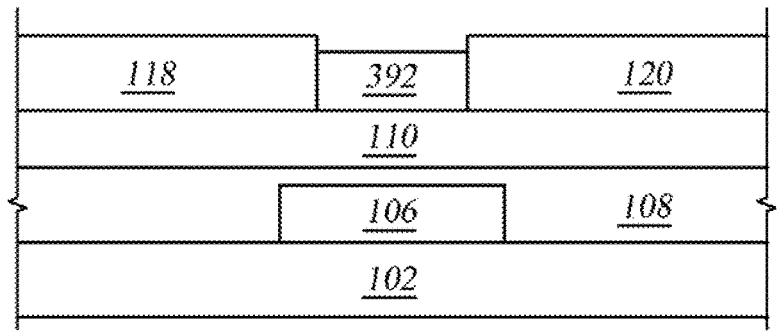
FIG. 3 schematically illustrates an etch stop TFT, according to one embodiment.

FIG. 3 schematically illustrates an alternate embodiment of an etch stop TFT 390. It is to be understood the operations of FIGS. 1A-1H may be used to form the device of FIG. 3. As shown in FIG. 3, however, an etch stop target material 392 may be formed prior to patterning the source electrode and/or the drain electrode, as discussed supra.

Figure 4:
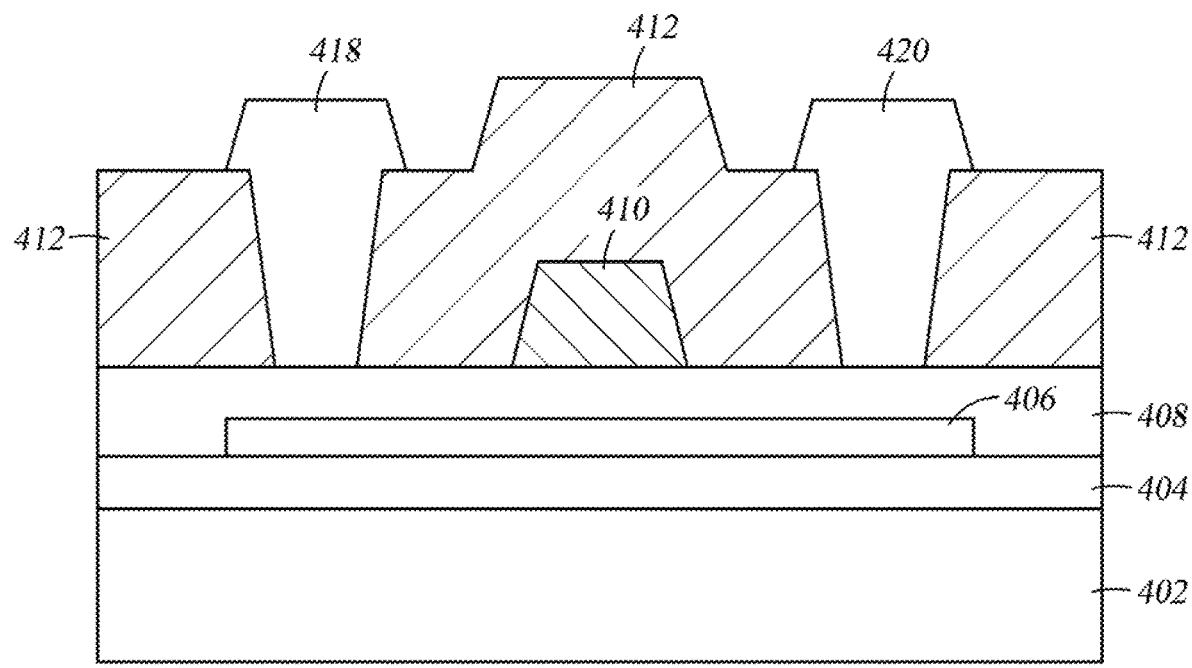
FIG. 4 schematically illustrates a top gate TFT, according to one embodiment.

FIG. 4 schematically illustrates an alternate embodiment of a gate insulator for a top gate TFT 400. The top gate TFT 400 is fabricated by depositing a barrier layer 404 over the substrate 402. Suitable materials that may be utilized for the substrate 402 include silicon, glass, plastic, and semiconductor wafers. Suitable materials that may be utilized for the barrier layer 404 include silicon-based materials, for example silicon nitride, silicon oxide, or silicon oxynitride among other materials. The barrier layer 404 may be formed by physical vapor deposition (PVD) or other suitable deposition methods, such as electroplating, electroless plating, or chemical vapor deposition (CVD). The barrier layer 404 may protect subsequent layers from contaminants produced from the substrate 402.

A metal-oxide layer 406 is deposited on the barrier layer 404. Suitable materials that may be used for the metal oxide layer 406 include any semiconducting metal oxide material, for example indium-gallium oxide, IGZO, zinc oxide, zinc oxynitride, indium-tin oxide, indium zinc oxide, or mixtures and combinations thereof. The metal oxide layer 406 may be deposited by suitable deposition methods such as PVD, ALD, CVD and PECVD. In one embodiment, the PVD may comprise applying a DC bias to a rotary cathode. A gate insulator layer 408 may be deposited on the metal oxide layer 406. Suitable materials that may be utilized for the gate insulator layer 408 include silicon-based materials, for example silicon nitride, silicon oxide, or silicon oxynitride among other materials. In some embodiments, the gate insulator layer 408 and the barrier layer 404 may comprise the same material.

A conductive layer may be formed over the gate insulator layer 408. Suitable materials that may be utilized for the conductive layer include chromium, molybdenum, copper, aluminum, tungsten, titanium, and mixtures or combinations thereof. The conductive layer may be formed by physical vapor deposition (PVD) or other suitable deposition methods, such as electroplating, electroless plating, or chemical vapor deposition (CVD). The conductive layer may be patterned to form a gate electrode 410. The patterning may occur by forming either a photolithographic mask or a hard mask over the conductive layer and exposing the conductive layer to an etchant. Depending upon the material utilized for the conductive layer, the conductive layer may be patterned using a wet etchant or by exposing the conductive layer not covered by the mask to an etching plasma. In one embodiment, the conductive layer may be patterned by etching areas of the conductive layer that are not covered by a mask with an etching plasma comprising etchants such as SF$_6$, O$_2$, Cl$_2$, and mixtures or combinations thereof. After the gate electrode 410 has been formed, an inter-layer dielectric (ILD) 412 is deposited thereover. Suitable materials that may be utilized for the ILD 412 include silicon nitride, silicon oxide, and silicon oxynitride. Additionally, while shown as a single layer, it is contemplated that the ILD 412 may comprise multiple layers, each of which may comprise a different chemical composition. Suitable methods for depositing the ILD 412 include conformal deposition methods such as plasma enhanced chemical vapor deposition (PECVD), chemical vapor deposition (CVD), and atomic layer deposition (ALD). The ILD 412 may be patterned to form a source electrode 418 and a drain electrode 420, completing the top gate TFT 400. The patterning may occur by forming either a photolithographic mask or a hard mask over the ILD 412 and exposing the ILD 412 to an etchant.

Figure 5:
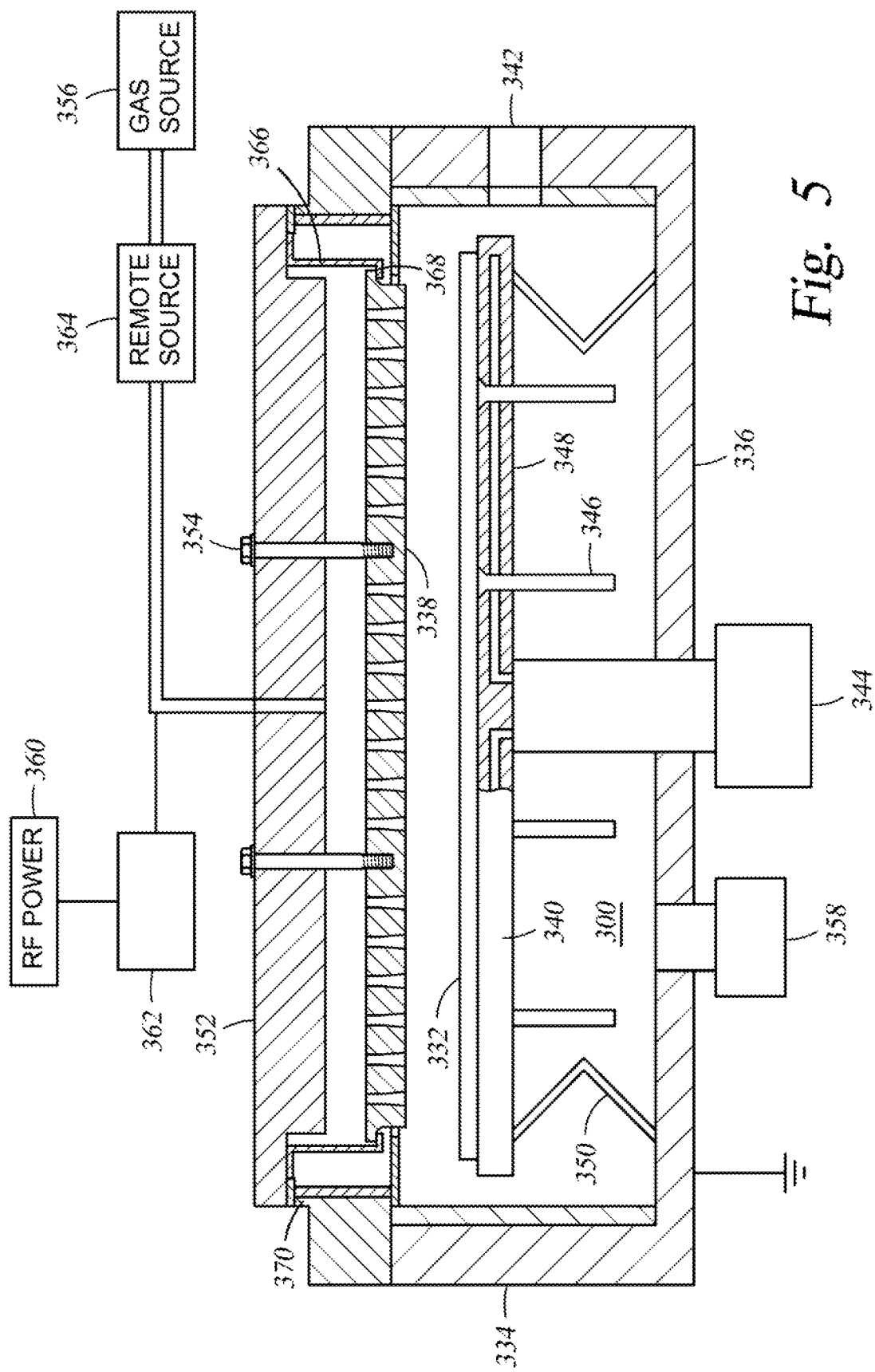
FIG. 5 schematically illustrates a cross sectional view of a PECVD apparatus, according to one embodiment.

FIG. 5 is a cross sectional view of a PECVD apparatus that may be utilized to produce the TFTs described herein. The apparatus includes a chamber 300 in which one or more films may be deposited onto a substrate 332. The chamber 300 generally includes walls 334, a bottom 336 and a showerhead 338 which define a process volume. A substrate support 340 is disposed within the process volume. The process volume is accessed through a slit valve opening 342 such that the substrate 332 may be transferred in and out of the chamber 300. The substrate support 340 may be coupled to an actuator 344 to raise and lower the substrate support 340. Lift pins 346 are moveably disposed through the substrate support 340 to move a substrate to and from the substrate-receiving surface. The substrate support 340 may also include heating and/or cooling elements 348 to maintain the substrate support 340 at a desired temperature. The substrate support 340 may also include RF return straps 350 to provide an RF return path at the periphery of the substrate support 340.

The showerhead 338 is coupled to a backing plate 352 by a fastening mechanism 354. The showerhead 338 may be coupled to the backing plate 352 by one or more fastening mechanisms 354 to help prevent sag and/or control the straightness/curvature of the showerhead 338.

A gas source 356 is coupled to the backing plate 352 to provide gas through gas passages in the showerhead 338 to a processing area between the showerhead 338 and the substrate 332. A vacuum pump 358 is coupled to the chamber 300 to control the process volume at a desired pressure. An RF source 360 is coupled through a match network 362 to the backing plate 352 and/or to the showerhead 338 to provide an RF current to the showerhead 338. The RF current creates an electric field between the showerhead 338 and the substrate support 340 so that a plasma may be generated from the gases between the showerhead 338 and the substrate support 340.

A remote plasma source 364, such as an inductively coupled remote plasma source 364, may also be coupled between the gas source 356 and the backing plate 352. Between processing substrates, a cleaning gas may be provided to the remote plasma source 364 so that a remote plasma is generated. The radicals from the remote plasma may be provided to chamber 300 to clean chamber 300 components. The cleaning gas may be further excited by the RF source 360 provided to the showerhead 338.

The showerhead 338 may additionally be coupled to the backing plate 352 by showerhead suspension 366. In one embodiment, the showerhead suspension 366 is a flexible metal skirt. The showerhead suspension 366 may have a lip 368 upon which the showerhead 338 may rest. The backing plate 352 may rest on an upper surface of a ledge 370 coupled with the chamber walls 334 to seal the chamber 300.

Once the substrate 332 is supported by the substrate support 340, processing gases may be introduced into the chamber and ignited into a plasma by RF power. The substrate 332 may thus be processed. Once processing has been completed, the substrate 332 may be power lifted from the substrate support 340. To power lift the substrate 332 from the substrate support 340, a gas may be introduced into the chamber. The gas may be a gas that does not chemically react with the processed substrate 332. If a gas that chemically reacts with the substrate 332 were used, then undesirable processing of the substrate 332 may occur. Therefore, the gas should be chemically inert relative to the processed substrate 332. In some embodiments, the gas may be any non-oxygen containing gas. In some embodiments, the gas may be any non-hydrogen containing gas. In other embodiments, the gas may be any non-oxygen containing and non-hydrogen containing gas. In one embodiment, the gas may be selected from nitrogen, argon, or nitrous oxide with low RF power.

The gas that has been introduced is ignited into a plasma. In one embodiment, the RF power used to ignite the plasma is lower than the RF power applied to generate the plasma used to deposited material onto the substrate 332. The processed substrate 332 is exposed to the plasma for a predetermined time period. In one embodiment, the time period is between about 5 seconds and about 15 seconds. Not wishing to be bound by theory, it is believed that the plasma of non-reactive gas removes, reduces, or redistributes the electrostatic charge built up on the substrate 332 and substrate support 340 such that the substrate 332 may be removed from contact with the substrate support 340 without damaging the substrate 332. The removal, reduction, or redistribution of the electrostatic charge reduces the stiction between the substrate 332 and the substrate support 340 and thus allows the substrate 332 to be more easily separated from the substrate support 340. By using a power lower than that used for the depositing of material, the charge applied to the substrate 332 and the substrate support 340 during the power lifting is limited. To separate the substrate 332 from the substrate support 340 after the power lifting, the substrate support 340 is lowered and the substrate 332 is supported by the lift pins 346. The substrate 332 separates from the substrate support 340 in an edge to center progression.

A TFT, such as TFT 100 or TFT 200, may be manufactured on the substrate 332. The etch stop 114 of TFT 100 or the one or more passivation layers 228, 230 of TFT 200 may be exposed to the inert plasma, such as Ar or $N_2$ plasma, during the power lift operation.

Post-treating an etch stop or passivation layers of a TFT with an inert plasma, such as Ar or $N_2$ plasmas, results in a TFT that performs consistently each use. The inert plasma post-treated TFT has stable behaviors, such as a constant threshold voltage, PBTS, and NBIS. Exposing the etch stop or the passivation layers to a post-treatment inert plasma does not change or degrade the performance of the completed TFT, allowing the TFT to work in a predictable and reliable manner each use. The on-voltage and the off-voltage of the TFT remains stable, and does not fluctuate or shift to a more negative or more positive voltage. Regardless of the device the TFT is utilized with, or the number of times the TFT is operated, the TFT will produce consistent results, having the same on-voltage and the same off-voltage each use.

While the foregoing is directed to embodiments of the present disclosure, other and further embodiments can be devised without departing from the basic scope thereof, and the scope thereof is determined by the claims that follow.

We claim:

1. A method of forming a thin film transistor, comprising:
    depositing a barrier layer over a substrate;
    depositing a metal oxide layer on the barrier layer;
    depositing a gate insulator layer on the metal oxide layer;
    exposing the gate insulator layer to an inert plasma;
    depositing a conductive layer over the gate insulator layer;
    patterning the conductive layer to form a gate electrode;
    depositing an inter-layer dielectric (ILD) over the gate electrode; and
    patterning the ILD to form a source electrode and a drain electrode, wherein the gate insulator layer is exposed to the inert plasma during a power lift operation.

2. The method of claim 1, wherein the inert plasma is an argon plasma.

3. The method of claim 1, wherein the inert plasma is a nitrogen plasma or a helium plasma.

4. The method of claim 1, further comprising exposing the ILD to a second inert plasma.

5. The method of claim 4, wherein the second inert plasma is an argon plasma.

6. The method of claim 4, wherein the second inert plasma is a nitrogen plasma or a helium plasma.

7. The method of claim 1, wherein the barrier layer comprises a first silicon-containing material selected from silicon nitride, silicon oxide, or silicon oxynitride and the metal oxide layer comprises a material selected from indium-gallium oxide, IGZO, zinc oxide, zinc oxynitride, indium-tin oxide, indium zinc oxide, and combinations thereof.

8. The method of claim 7, wherein the gate insulator layer and the ILD each individually comprise a second silicon-containing material selected from silicon nitride, silicon oxide, or silicon oxynitride and the conductive layer comprises a material selected from chromium, molybdenum, copper, aluminum, tungsten, titanium, or a combination thereof.

9. A method of forming a thin film transistor, comprising:
    depositing a barrier layer over a substrate;
    depositing a metal oxide layer on the barrier layer;
    depositing a gate insulator layer on the metal oxide layer;
    exposing the gate insulator layer to an inert plasma after depositing the gate insulator layer;
    depositing a conductive layer over the gate insulator layer;
    patterning the conductive layer to form a gate electrode;
    depositing an inter-layer dielectric (ILD) over the gate electrode; and patterning the ILD to form a source electrode and a drain electrode, wherein the inert plasma is an argon plasma or a helium plasma, wherein the gate insulator layer is exposed to the inert plasma during a power lift operation.

10. The method of claim 9, further comprising exposing the ILD to a second inert plasma.

11. The method of claim 10, wherein the second inert plasma is an argon plasma.

12. The method of claim 10, wherein the second inert plasma is a nitrogen plasma or a helium plasma.

13. The method of claim 9, wherein the barrier layer comprises a first silicon-containing material selected from silicon nitride, silicon oxide, or silicon oxynitride and the metal oxide layer comprises a material selected from indium-gallium oxide, IGZO, zinc oxide, zinc oxynitride, indium-tin oxide, indium zinc oxide, and combinations thereof.

14. The method of claim 13, wherein the gate insulator layer and the ILD each individually comprise a second silicon-containing material selected from silicon nitride, silicon oxide, or silicon oxynitride and the conductive layer comprises a material selected from chromium, molybdenum, copper, aluminum, tungsten, titanium, or a combination thereof.

15. The method of claim 9, wherein the gate insulator layer and the barrier layer comprise the same silicon-containing material selected from silicon nitride, silicon oxide, or silicon oxynitride.

16. A method of forming a thin film transistor, comprising:
positioning a substrate on a substrate support in a processing chamber, wherein the substrate has a barrier layer and a metal oxide layer formed over the substrate;
depositing a gate insulator layer over the metal oxide layer and the barrier layer, wherein depositing the gate insulator layer comprises igniting a plasma at a first RF power; and
power-lifting the processed substrate from the substrate support, wherein power-lifting the substrate comprises:
exposing the substrate to an inert gas plasma, wherein the inert gas plasma is formed at a second RF power less than the first RF power.

17. The method of claim 16, wherein the inert gas plasma is an argon plasma.

18. The method of claim 16, wherein the inert gas plasma is a nitrogen plasma or a helium plasma.

19. The method of claim 16, wherein the gate insulator layer contacts both the barrier layer and the metal oxide layer.

20. The method of claim 16, further comprising:
depositing a conductive layer over the gate insulator layer;
patterning the conductive layer to form a gate electrode;
depositing an inter-layer dielectric (ILD) over the gate electrode; and
patterning the ILD to form a source electrode and a drain electrode.

\* \* \* \* \*